US006924699B2

(12) United States Patent
Ahmed

(10) Patent No.: US 6,924,699 B2
(45) Date of Patent: Aug. 2, 2005

(54) APPARATUS, METHODS AND ARTICLES OF MANUFACTURE FOR DIGITAL MODIFICATION IN ELECTROMAGNETIC SIGNAL PROCESSING

(75) Inventor: Walid K. M. Ahmed, Tinton Falls, NJ (US)

(73) Assignee: M/A-Com, Inc., Lowell, MA (US)

( * ) Notice: Subject to any disclaimer, the term of this patent is extended or adjusted under 35 U.S.C. 154(b) by 145 days.

(21) Appl. No.: 10/382,684

(22) Filed: Mar. 6, 2003

(65) Prior Publication Data

US 2004/0183635 A1 Sep. 23, 2004

(51) Int. Cl.$^{7}$ .................................................. H03F 1/26
(52) U.S. Cl. ............................................ 330/149; 330/2
(58) Field of Search ............................ 330/2, 149, 129, 330/254; 375/297; 455/63

(56) References Cited

U.S. PATENT DOCUMENTS

| | | | | |
|---|---|---|---|---|
| 3,978,422 | A | | 8/1976 | Rheinfelder |
| 4,580,111 | A | | 4/1986 | Swanson |
| 4,586,000 | A | | 4/1986 | Wagner |
| 4,646,359 | A | | 2/1987 | Furrer |
| 5,278,997 | A | | 1/1994 | Martin |
| 5,311,143 | A | | 5/1994 | Soliday |
| 5,410,280 | A | | 4/1995 | Linguet et al. |
| 5,642,002 | A | | 6/1997 | Mekanik et al. |
| 5,774,017 | A | | 6/1998 | Adar |
| 5,818,298 | A | | 10/1998 | Dent et al. |
| 5,880,633 | A | | 3/1999 | Leizerovich et al. |
| 5,892,431 | A | | 4/1999 | Osterman |
| 5,930,128 | A | | 7/1999 | Dent |
| 5,939,951 | A | | 8/1999 | Bateman et al. |
| 5,942,946 | A | | 8/1999 | Su et al. |
| 5,952,895 | A | | 9/1999 | McCune, Jr. et al. |
| 6,043,707 | A | | 3/2000 | Budnik |
| 6,043,712 | A | | 3/2000 | Leizerovich et al. |
| 6,075,413 | A | | 6/2000 | Katakura |
| 6,078,219 | A | * | 6/2000 | Hadjichristos et al. ...... 330/254 |
| 6,078,628 | A | | 6/2000 | Griffith et al. |
| 6,094,101 | A | | 7/2000 | Sander et al. |
| 6,097,252 | A | | 8/2000 | Sigmon et al. |
| 6,101,224 | A | | 8/2000 | Lindoff et al. |
| 6,112,071 | A | | 8/2000 | McCune, Jr. |
| 6,133,788 | A | | 10/2000 | Dent |
| 6,140,875 | A | | 10/2000 | Van Den Homberg et al. |
| 6,140,882 | A | | 10/2000 | Sander |
| 6,147,553 | A | | 11/2000 | Kolanek |
| 6,157,681 | A | | 12/2000 | Daniel et al. |
| 6,191,653 | B1 | | 2/2001 | Camp, Jr. et al. |
| 6,198,347 | B1 | | 3/2001 | Sander et al. |
| 6,201,452 | B1 | | 3/2001 | Dent et al. |
| 6,215,355 | B1 | | 4/2001 | Meck et al. |
| 6,219,394 | B1 | | 4/2001 | Sander |
| 6,236,284 | B1 | | 5/2001 | Duello et al. |
| 6,242,975 | B1 | | 6/2001 | Eidson et al. |
| 6,246,286 | B1 | | 6/2001 | Persson |
| 6,255,906 | B1 | | 7/2001 | Eidson et al. |
| 6,259,901 | B1 | | 7/2001 | Shinomiya et al. |

(Continued)

FOREIGN PATENT DOCUMENTS

WO WO 01/10013 A1 2/2001

OTHER PUBLICATIONS

Hulick, "The Digital Linear Amplifier", Schwenksville, Pennsylvania.

(Continued)

*Primary Examiner*—Henry Choe

(57) ABSTRACT

Apparatus, methods and articles of manufacture are disclosed for digital signal modification. Various wave characteristics of an electromagnetic wave may be modified according to desired values. Those values are provided to one or more current sources, wherein the output values of the current sources are modified accordingly.

9 Claims, 4 Drawing Sheets

U.S. PATENT DOCUMENTS

| | | | | |
|---|---|---|---|---|
| 6,269,135 | B1 | 7/2001 | Sander | |
| 6,285,251 | B1 | 9/2001 | Dent et al. | |
| 6,288,916 | B1 | 9/2001 | Liu et al. | |
| 6,294,957 | B1 | 9/2001 | Luu | |
| 6,311,046 | B1 | 10/2001 | Dent | |
| 6,313,703 | B1 | 11/2001 | Wright et al. | 330/149 |
| 6,317,608 | B1 | 11/2001 | Glöcker | |
| 6,321,072 | B1 | 11/2001 | Cipriani et al. | |
| 6,323,731 | B1 | 11/2001 | McCune, Jr. | |
| 6,356,155 | B1 | 3/2002 | Judkins | |
| 6,366,177 | B1 | 4/2002 | McCune et al. | |
| 6,369,657 | B2 | 4/2002 | Dening et al. | |
| 6,377,784 | B2 | 4/2002 | McCune | |
| 6,380,802 | B1 | 4/2002 | Pehike et al. | |
| 6,404,823 | B1 | 6/2002 | Grange et al. | |
| 6,411,655 | B1 | 6/2002 | Holden et al. | |
| 6,426,677 | B1 | 7/2002 | Prentice | |
| 6,426,678 | B1 | 7/2002 | Ko | |
| 6,430,402 | B1 | 8/2002 | Agahi-Kesheh | |
| 6,445,247 | B1 | 9/2002 | Walker | |
| 6,449,465 | B1 | 9/2002 | Gailus et al. | |
| 6,552,612 | B1 * | 4/2003 | Wilson | 330/254 |
| 6,583,668 | B1 * | 6/2003 | Liu et al. | 330/254 |
| 6,753,730 | B2 * | 6/2004 | Yamamoto | 330/253 |
| 2002/0063644 | A1 | 5/2002 | Clara et al. | 341/136 |

OTHER PUBLICATIONS

Kozyrey, "Single–Ended Switching–Mode Tuned Power Amplifier with Filtering Circuit", Poluprovodnikovye pribory v tekhnike svyazi, 1971, pp. 152–166, vol. 6.

TimeStar™, "Multi–Mode Polar Modulator", 2002, Tropian Headquarters, USA.

Sundstrom, "Digital RF Power Amplifier Linearisers", 1995, Sweden.

Kenington, "Linearised RF Amplifier and Transmitter Techniques", Microwave Engineering Europe, Nov. 1998, pp. 35–.

Mann, et al., "Increasing Talk–Time with Effecient Linear PAs", Presented at IEE Colloquim on Tetra Market and Technology Developments, Feb. 2000, London.

Mann, et al., "Increasing the Talk–Time of Mobile Radios with Effecient Linear Transmitter Architectures", Electronics & Communication Engineering Journal, Apr. 2001, pp. 65–76, vol. 13, No. 2.

Heimbach, "Digital Multimode Technology Redefines the Nature of RF Transmission", Applied Microwave & Wireless, Aug. 2001.

Swanson, "Digital AM Transmitters", IEEE Transactions on Broadcasting, Jun. 1989, pp. 131–133, vol. 35, No. 2.

Tropian–Products Main, www.tropian.com/products/, Copyright 2000–2001, Aug. 14, 2002.

"Tropian and Agilent Technologies announce collaboration on multi–band, multi–mode 2.5G transmitter solutions", Feb. 18, 2002, Connes, France.

"Tropian Awarded 8$^{th}$ U.S. Patent for Wireless Technology: Innovative RF Power Processing Circuit Architecture Achieves Speed and Accuracy in Polar Modulation," Aug. 6, 2001, Cupertino, California.

Dialog Web Command Mode, p. 1 of 1, Sep. 17, 2002, Record 03929207, Polar Modulators for 1 and 2 GHz Power Amplifier Correction, Nisbet, J.

Dialog Web Command Mode, p. 1 of 1, Sep. 17, 2002, Record 0326082, A new Class–AB Design, DE Jager, et al., Electronics World 105, Dec 1999, p. 982–7.

Dialog Web Command Mode, p. 1 of 1, Sep. 17, 2002, Record 2371235, Increasing the talk–time of mobile radios with efficient linear transmitter architectures, Mann et al., Electronics & Communication Engineering Journal, v. 13, No. 2, Apr. 2001 (p. 65–76).

Dialog Web Command Mode, p. 1 of 3, Sep. 17, 2002, Record 15595216, The big climate amplifier ocean circulation–sea–ice–storminess–dustiness–albedo, Broecker, Geophysical Monograph, 2001, 126, 53–56, etc.

Dialog Web Command Mode, p. 1 of 9, Sep. 9, 2002, Record 10872787, Out–of–band emissions of digital transmissions using Kahn EER technique, Rudolph, IEEE Transactions on Microwave Theory & Techniques, 2002, V 50, N 8, Aug, p. 1979–1983, etc.

Dialog Web Command Mode, p. 1 of 20; Sep. 17, 2002. Record 01239474, GSM players Eye Edge Despite Transmit Woes, Keenan, Electronic Engineering Times, 2002, n 1211, p. 6.

* cited by examiner

APPARATUS, METHODS AND ARTICLES OF MANUFACTURE FOR DIGITAL MODIFICATION IN ELECTROMAGNETIC SIGNAL PROCESSING

FIELD OF THE INVENTION

This invention relates generally to electromagnetic signal processing. More particularly, this invention relates to digital modification in electromagnetic signal processing.

BACKGROUND OF THE INVENTION

Electromagnetic waves have, until fairly recently, been modified using analog techniques. That is, there had been no attempt to isolate discrete wave characteristics such as current, voltage and the like and modify those characteristics in order to modify the wave itself. Recently, wave modification techniques have become digitized, so that characteristics of the wave can be isolated and modified directly in order to achieve a desired result. Digitization has become desirable because it usually provides more speed and precision in wave modification while drawing less power than previous methods.

For example, digitization of wave characteristics has led to improvements in filtering techniques. Through digitizing wave characteristics, it is possible to quickly and accurately create and/or modify, (e.g. implement, emphasize, isolate and filter) frequencies and other wave characteristics.

Accordingly, it would be helpful to the art of electromagnetic wave modification if apparatus, methods, and articles of manufacture were provided that utilize digitized electromagnetic wave characteristics in order to create and/or modify electromagnetic waves.

SUMMARY OF THE INVENTION

Embodiments of the present invention include apparatus, methods and articles of manufacture for modifying electromagnetic waves. At least one wave characteristic of the wave is modified via regulation of at least two independently controllable current sources. The modification is through a predetermined value. An output current may then be generated from the at least two independently controllable current sources.

DETAILED DESCRIPTION OF THE PREFERRED EMBODIMENTS

Figure 1:
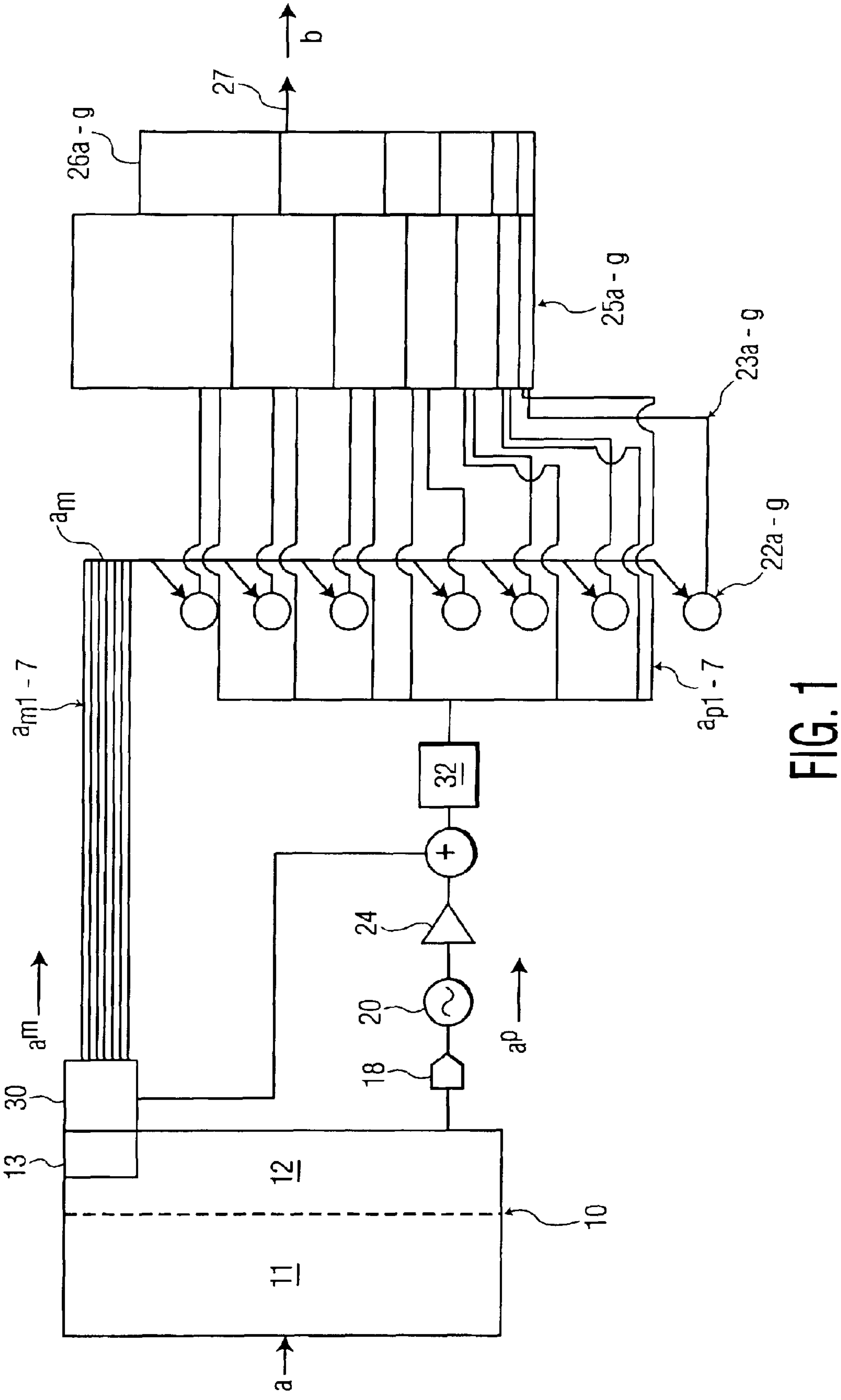
FIG. 1 shows a preferred embodiment.

FIG. 1 shows a preferred embodiment. An input wave a is provided to a Digital Signal Processor 10. Digital Signal Processor 10 comprises an Analog to Digital Converter 11, which digitizes the wave, for example, by the use of rectangular coordinates or I,Q data. Rectangular to Polar Converter 12 then receives the I,Q data and translates it into polar coordinates. It should be noted that, in other embodiments, a digitized representation of a wave may be provided to a rectangular to polar converter if desired. In those embodiments, the digitized representation may be generated in any of a number of ways as is known in the art. Also, while this embodiment is described as used in connection with a digitized wave and I,Q and polar data, those of ordinary skill in the art will appreciate that other embodiments are not limited thereto and may use any digital or analog wave form, or combination thereof.

Returning now to the embodiment of FIG. 1, Rectangular to Polar Converter 12 outputs a digitized wave in polar coordinates, which takes the form R, P(sin) and P(cos) for example. In this example, the R coordinate represents the amplitude characteristic of the wave. The P(sin) and P(cos) coordinates represent the phase characteristic of the wave. It should be noted that "characteristic," as used herein, refers to electromagnetic wave characteristics, such as frequency, voltage, amplitude (including magnitude and envelope), phase, current, wave shape, or pulse. Other embodiments may derive one or more wave characteristics from the input wave as desired.

Figure 2:
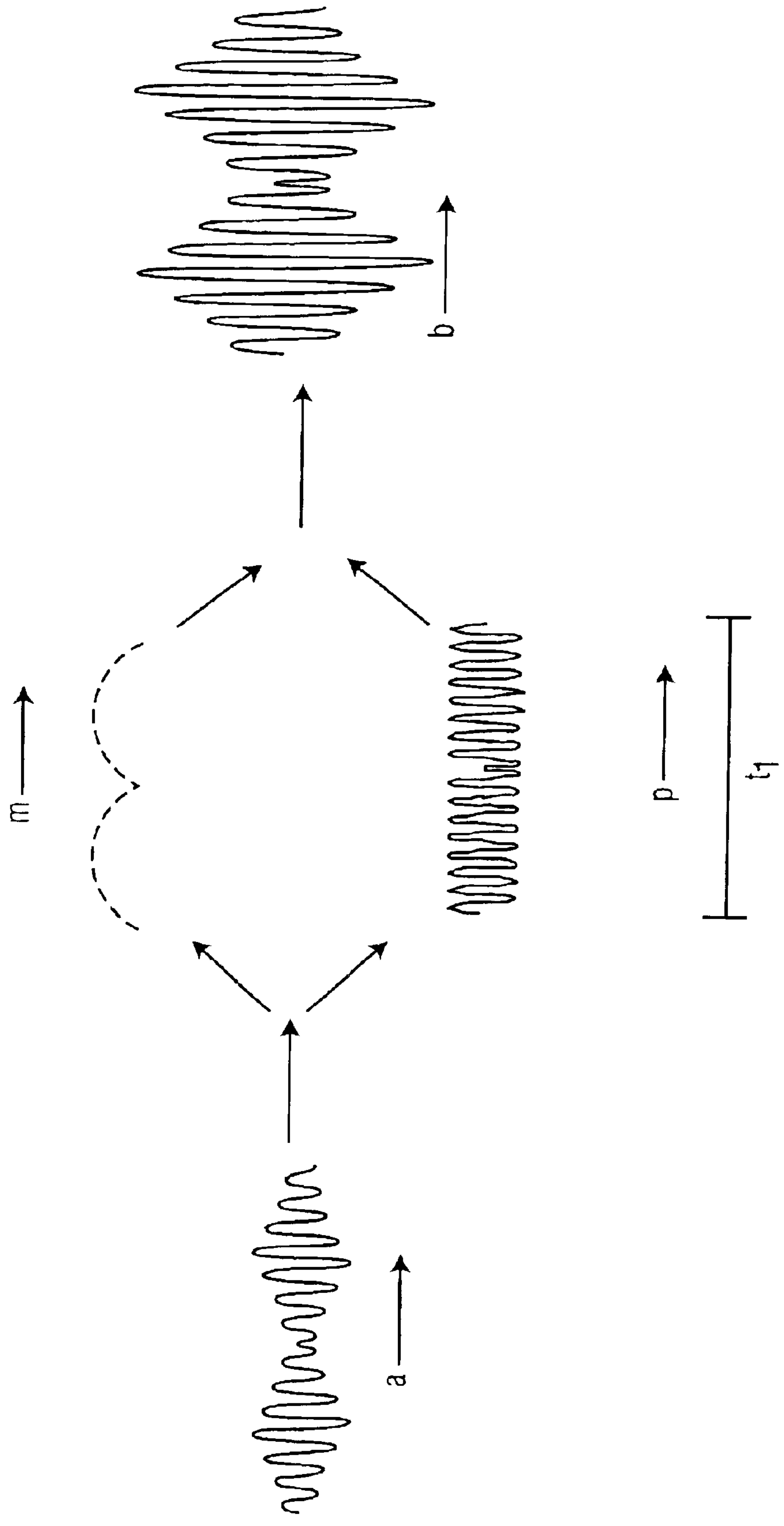
FIG. 2 shows a preferred embodiment.

Turning briefly to FIG. 2, a schematic diagram of a wave that has been translated according to the embodiment of FIG. 1 is shown. Input wave a has been translated into magnitude component m comprising magnitude characteristics of the input wave over period $t_1$ and phase component p comprising phase characteristics on a carrier wave over the same period. Output wave b is shown after amplification by a preferred embodiment. It should be noted that the time period in this and other embodiments is as desired. For example, embodiments may derive magnitude and phase characteristics of a wave using various sampling rates in order to maximize resolution of the wave, maximize speed of operation, etc. These sampling rates may be dynamically determined as well in various embodiments so that they change during operation. In the preferred embodiments, the division of an input wave is synchronized, in order to maximize accuracy of output and minimize any distortion.

Returning now to FIG. 1, amplitude and phase characteristics are then transmitted through separate paths. The amplitude characteristics of the input wave are converted, via converter 13, along path $a^m$, into digital pulses comprising a digital word quantized into bits $B_0$ to $B_{n-1}$, with a Most Significant Bit ("MSB") to Least Significant Bit ("LSB"). The digital word may be of varying lengths in various embodiments. In general, the longer the word the greater the accuracy of reproduction of the input wave. The digital word provides control for attenuation and/or amplification, in manner to be described further below. Of course, as is described further below, in other embodiments, a differently composed digital word may be used, as well as other types of derivation and/or provision of amplitude or other wave characteristics.

Modulator 13 then splits the bits, each of which are a time-domain square waveform onto separate paths 0 to N−1. Each of the digital pulses are sent to Signal Modifier 30, which provides an optimization of the output signal. As shown in the embodiment of FIG. 1, Signal Modifier 30 provides an input, which is a phase pre-modification to Phase Modulator 32, as well as an input to an input port of transistor 25, providing amplitude modulation through activation of segments of transistor 25, as will be described in further detail below. In the preferred embodiment, Signal Modifier 30 comprises a digital processor with Look Up Table (LUT) and an algorithm (e.g., program) for correcting the amplitude signal $a^m$ and/or phase signal $a^p$ via entered values corresponding to desired output states of transistor 25. In other embodiments, the use and/or values of Signal Modifier 30 may be dynamically determined. For example, there may be uses where there is no desire to apply a signal modifier and it may be switched on and off. As another example, there may be a dynamic change in values applied via a signal modifier as environmental variables change, etc. In yet other embodiments, other means such as low pass filters, band pass filters, etc., may be used to supply values and/or apply modifications based on desired output states of transistor 25. Any such equation used to determine an impulse response for a IIR, FIR, etc. may be based on calculations as known in the art. Various integrated circuit components that may be used in this regard, including but not limited to PROMs, EEPROMs, and the like.

In the embodiment of FIG. 1, seven control component lines $a^m$ 1–$a^m$ 7 are shown leading away from the converter 13. The number of these control component lines depends, in the preferred embodiments, upon the resolution of the word. In this preferred embodiment, the word has a seven bit resolution. It should be noted in FIG. 1 that, for ease of viewing the figure, the control component lines are consolidated into a single path $a^m$ leading into control components 22*a–g*. However, in the embodiment, and as further described below, the control component lines are not consolidated and instead feed into the control components individually.

The phase characteristic travels along path $a^p$. Here the phase characteristic is first modulated onto a wave by way of Digital to Analog Converter 18 and Synthesizer 20 (which is a Voltage Controlled Oscillator in an especially preferred embodiment.) Synthesizer 20 provides an output wave, which is comprised of the phase information. This output wave has a constant envelope, i.e., it has no amplitude variations, yet it has phase characteristics of the original input wave, and passes to driver 24, and in turn driver lines $a^p$ 1–$a^p$ 7. The wave, which has been split among the driver lines, is then fed into current sources 25*a*–25*g*, and will serve to potentially drive the current sources 25*a*–25*g* as is further described below. In other embodiments, other sources of other wave characteristics, i.e., besides the phase characteristic, may be used.

It should be noted that, in the present embodiment, transistors may be used as current sources 25*a*–25*g*. Additionally, in other embodiments, one or more transistors segmented appropriately may be used as current sources 25*a*–25*g*. The current sources 25*a*–25*g* must not be driven into saturation. Otherwise, the current sources will cease to act as current sources and instead act as voltage sources, which will interfere with the desired current combining of the sources.

Path $a^m$ (comprised of control component lines $a^m$ 1–$a^m$ 7 as described above) terminates in control components 22*a–g*. In the especially preferred embodiment, these are switching transistors, and are preferably current sources, although, as further described below, in other embodiments, other sources of other wave characteristics may be used, as well as other regulation schemes. Control components 22*a–g* are switched by bits of the digital word output from the amplitude component and so regulated by the digital word output from the amplitude component. If a bit is "1" or "high," the corresponding control component is switched on, and so current flows from that control component to appropriate current source 25*a–g* along bias control lines 23*a–g*. As had been noted above, the length of the digital word may vary, and so the number of bits, control components, control component lines, driver lines, bias control lines, current sources, etc. may vary accordingly in various embodiments. Moreover, there does not have to be a one to one correspondence among digital word resolution, components, lines and current sources in various embodiments.

Current sources 25*a–g* receive current from a control component if the control component is on, and thus each current source is regulated according to that component. In the especially preferred embodiments an appropriate control component provides bias current to the current sources, as is described further below, and so the control component may be referred to as a bias control circuit, and a number of them as a bias network. In some embodiments, it may be desired to statically or dynamically allocate one or more bias control circuits to one or more current sources using a switching network if desired.

Returning now to the embodiment of FIG. 1, each current source serves as a potential current source, and is capable of generating a current, which is output to current source lines 26*a–g* respectively. Each current source may or may not act as a current source, and so may or may not generate a current, because it is regulated via the appropriate digital word value regulating a control component. Activation of any current source, and generation of current from that current source, is dependant upon the value of the appropriate bit from the digital representation of the amplitude component regulating the appropriate control component.

It should be noted that the current sources are not an amplifier or amplifiers in the preferred embodiments, rather the plurality of current sources function as an amplifier, as is described herein. Indeed, amplification and/or attenuation may be considered in the preferred embodiments as functions of those embodiments, and so may an amplifier and/or attenuator be considered to be an electrical component or system that amplifies and/or attenuates.

The combined current, i.e. the sum of any current output from current sources 25*a–g*, is the current sources output. Thus the embodiment may act as an attenuator and/or amplifier. No further circuitry or components are necessary between the current sources to combine current from each current source and so provide a useful output current. Therefore, the combined current, which is output on line 27, and shown as b, may be used as desired, e.g., as an amplifier, as an attenuator, to drive a load, etc.

In the preferred embodiments, the current sources vary in current output and size. This provides various weighting to the currents that are potentially supplied by those current sources. For example, in one preferred embodiment, a first current source is twice the size of a next current source, which in turn is twice the size of a next current source, and so on until a final current source. The number of current sources may be matched to the number of bits of the digital control word, so that the largest current source is controlled by the MSB of the amplitude word, the next bit of the word controls the next largest current source, etc., until the LSB, which is sent to the smallest current source. Of course, as had been noted above, other embodiments may have a different pattern of matching bit to current source, including use of a switching network. Moreover, in an especially preferred embodiment, duplicate current sources—of the same size—are provided, as well as current sources that vary in size. In yet other embodiments, other wave characteristics may be provided to other current sources and so regulate those sources.

The total current that is output from the current sources in various embodiments may be ideally projected to be a particular value. However, variables in operation may affect the projection. Therefore, embodiments may modify amplitude and/or phase characteristic components of the input wave, and so modify the input to the current sources in order to attempt to meet projected output. For example, in the embodiment of FIG. 1, Signal Modifier 30 may implement modification to the amplitude and/or phase characteristic components of the input wave, which in turn will modify the activation and operation of the current sources 25*a–g*.

Figure 3:
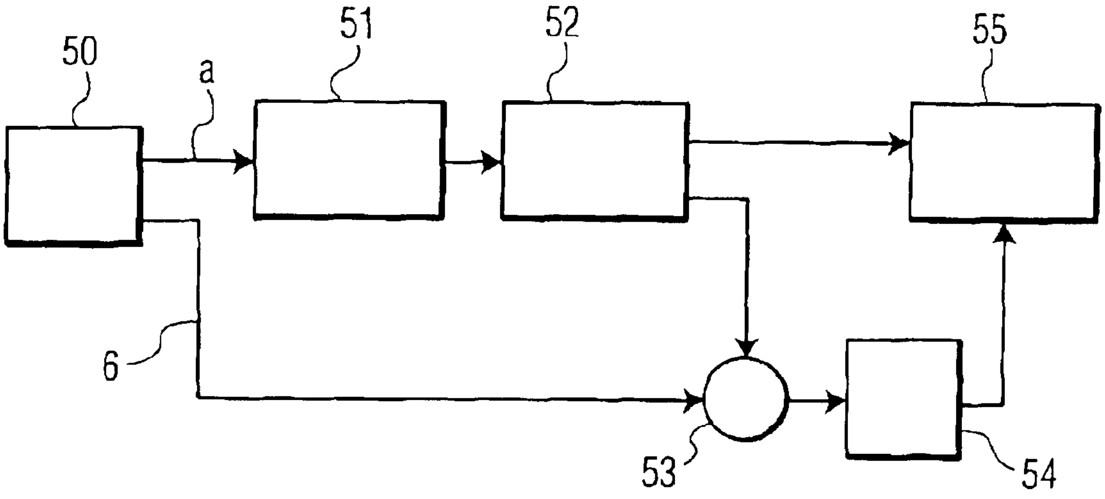
FIG. 3 shows a preferred embodiment.

Another embodiment is shown in block form in FIG. 3. Polar converter 50 provides conversion from I, Q coordinates of a wave to polar characteristics for the wave. The amplitude characteristic travels along path a and the phase characteristic along path b. The amplitude signal passes through a n-bit quantizer 51, which divides the wave among a number of lines in a fashion similar to that described above with regard to FIG. 1. The wave then passes to modifier 52, which provides the desired modification to the amplitude characteristic. Modifier 52 also provides the desired modification to the phase characteristic, as will be described further below. The amplitude characteristic, as modified over the n-bit split waves, and then is input to current source 55.

The phase characteristic, along path b, is input to adder 53, where any phase modification from modifier 52 is mixed into the phase characteristic. From adder 53, it passes to phase modulator 54, where it is appropriately modified prior to being output to current source 55.

The output of current source 55 is a modified wave, similar to that described above with regard to FIG. 1.

Through use of a signal modifier, amplitude and/or phase characteristics may be modified so as to implement that desired output value. So for example, if current sources are provided that are to provide an output of X ohms, yet through various system discrepancies, losses, etc. X-4 ohms are output, the desired modification will modify the amplitude information so as to compensate for the loss.

Figure 4:
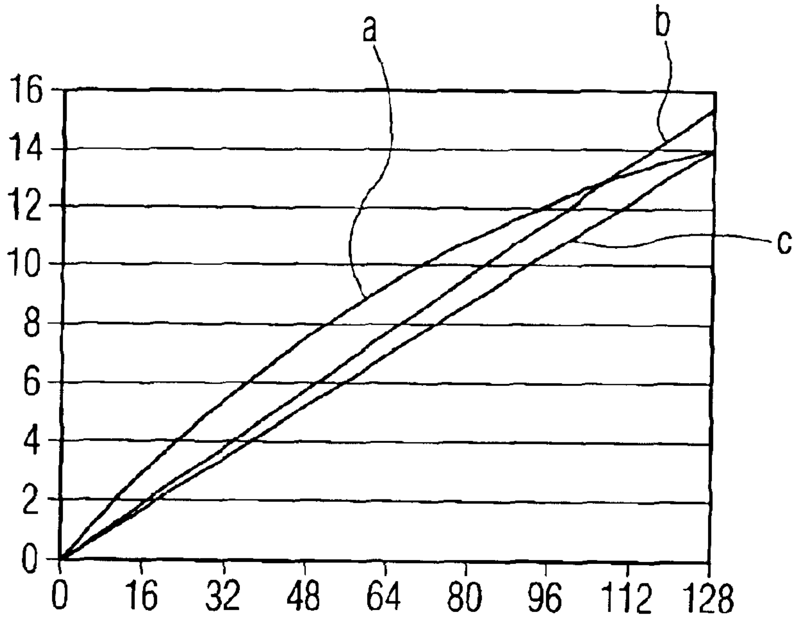
FIG. 4 shows an example of a graph illustrating various possible outputs across a range of current sources.

FIG. 4 shows an example of a graph illustrating various outputs across a range of current sources. Output plot a shows a range of output voltages using a set of current sources similar to the current sources 25*a–g* shown in FIG. 1. The input state of those sources is determined through combining the sources in a similar fashion as was described above. So, for example, combining a current sources with a potential weighted value of 16x with another source with a potential weighted value of 8x leads to a input value, or state, of 24x. Available current sources, in this embodiment, have potential weighted values of 32x, 32x, 16x, 16x, 8x, 8x, 8x, 4x, 2x, and 1x. Each value of each available current source may or may not be activated, according to the input state. The range of potential values is from 0x (when all potential current sources are de-activated) to 127x (when all potential current sources are activated.)

Output curve a of the embodiment of FIG. 4 shows the range of output voltage values across the range of input current source values. As can be seen, a bowing in the mid range is experienced in the curve. This bowing may not be desired, insofar as a linear output may be better suited to the system. Thus, curve b and c are introduced in order to begin the calculation of appropriate output modification. Curve b constitutes the least mean square error regression line. Curve c constitutes an end points connecting line.

Figure 5:
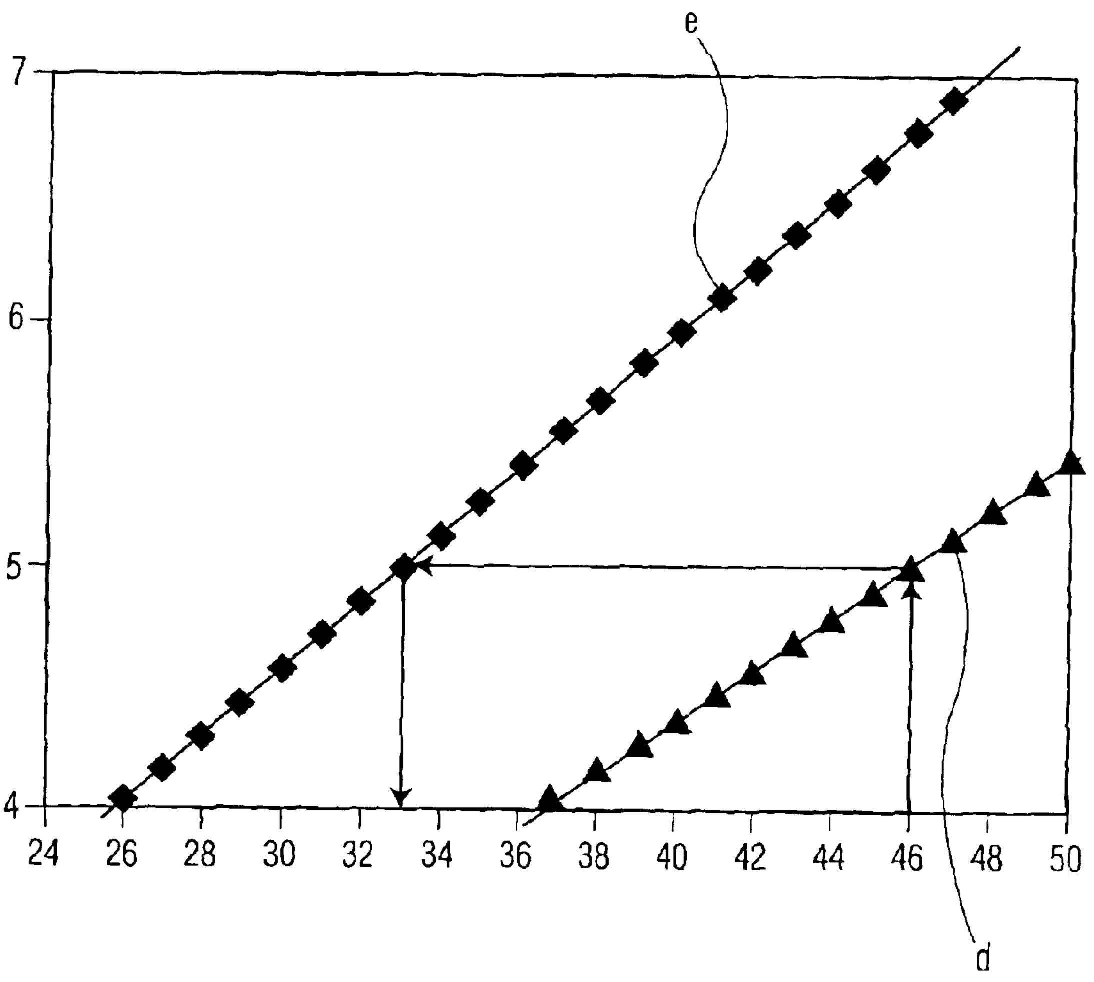
FIG. 5 shows a graph of potential implementation of a preferred embodiment.

Implementing curve b in this embodiment may be done through a plot as shown in FIG. 5. The output voltages of various LSME states, from 24 and 50, are shown by curve d. Curve e is also plotted, which is the measured output along the bowed curve a of FIG. 4. The desired output voltage according to the straight line choice is then drawn to curve e, which, then provides the state that should be activated according to the bowed curve e, or actual input states to be implemented.

So, for example, as shown at x, an input state 46 corresponds in the LSME to a output voltage of 5, which in turn corresponds to an input state of 33 along curve e. Thus a LUT will be implemented with amplitude modification so as to initiate an input state of 46, which will output the desired output voltage of 5, in order to maintain a straight line voltage.

In the preferred embodiments, therefore, a modification scheme is determined and then implemented. In the especially preferred embodiments, amplitude modification is implemented along with phase modification. Phase modification may be implemented through a LUT, LUTs, and/or other means as known in the art such as a filter, etc., so that any potential phase distortion introduced by amplitude modification is corrected as well, as will be further described below.

In general, the values for a LUT or other modifier are calculated by first determining the desired output values across all current sources of an amplifier. This determination is often made via a straight line projection, as the current sources, although operating non-linearly, will have a linear output. Each output state of the current sources is defined as a state-out value. The input, or "state-in" required (or number of current sources to be active) to obtain the output is determined for each of the straight-line approximations. Generally, in the preferred embodiments, any modification is implemented in order to increase output linearity, that is, precision of the output wave, so as to attempt to eliminate undesired bowing or other attributes of the output wave. As another example, it might be desired to emphasize certain frequencies in the signal, or other characteristics. Thus, other embodiments may be used for other than a straight line approximation.

Once the approximations are obtained, the values are placed in a LUT or other signal modifier. In the preferred embodiments, the values are current source potential weighted values (i.e., current sources to be activated) as activated by various input state values.

For example, a current source output value of 26x may be desired. Accordingly, an input value appropriate to achieve that current output value, (i.e. to activate current sources 16x, 8x, and 2x,) will be output from the LUT.

Output values may be achieved through measurement of segments, through approximations, etc. In the especially preferred embodiments, a straight-line approximation across the end points is used. Other methods may use least mean square error (LMSE) regression line, or any other desired method. Values that may be affected by modification according to various embodiments include Rho, ACPR1(dB), ACPR2(dBm), Noise Floor, Efficiency, Tx Power (dBm), etc.

It may be desired to modify the signal prior to any translation into polar coordinates. For example, a COordinate Rotation Digital Computer (CORDIC) algorithm or other means may be used in certain embodiments in order to translate I,Q coordinates of a wave into polar coordinates. A signal modifier may then be implemented in the IQ domain prior to polar translation. In yet other embodiments, partial modification, e.g., implementing the phase modification, prior to translation, and implementing amplitude modification after translation. These embodiments may be desirable where there is a degree of bit-resolution in the IQ domain. Components, such as adders and multipliers may be used in pre-polar translation embodiments in order to appropriately modify a wave.

Various embodiments may take the form of an entirely hardware embodiment or an embodiment combining software and hardware aspects. Accordingly, individual blocks and combinations of blocks in the drawings support combinations of means for performing the specified functions and combinations of steps for performing the specified functions. Each of the blocks of the drawings, and combinations of blocks of the drawings, may be embodied in many different ways, as is well known to those of skill in the art.

While the invention has been described by illustrative embodiments, additional advantages and modifications will occur to those skilled in the art. Therefore, the invention in its broader aspects is not limited to specific details shown and described herein. Modifications, for example, to weighting methods and current source type, may be made without departing from the spirit and scope of the invention. Other components may be interposed as well and various embodiments may provide desired levels of precision. For example, the length of the digital word may be longer or shorter in various embodiments, thus providing a more or less precise digitzation of the wave. As other examples, the number of control components, transistor segments, etc. may all be desired. Accordingly, it is intended that the invention not be limited to the specific illustrative embodiments, but be interpreted within the full spirit and scope of the appended claims and their equivalents.

What is claimed is:

1. A method for electromagnetic processing comprising:

modifying a wave characteristic with a predetermined value, wherein said predetermined value is derived from a predetermined output of at least two independently controllable current sources; and implementing said predetermined output via a signal modifier, wherein said signal modifier comprises a Look Up Table.

2. A method for signal processing comprising:

deriving a wave characteristic from an electromagnetic wave;

modifying said wave characteristic based upon a predetermined value;

providing said modified wave characteristic to at least one amplifier which is also regulated by said modified wave characteristic so as to produce an output, wherein said predetermined value is derived through a desired output of said amplifier; and, implementing said predetermined value via a signal modifier, wherein said signal modifier comprises a Look Up Table.

3. A method of providing linearity in a non-linear system, wherein said non linear system comprises at least two current sources, said method comprising the steps of:

determining any potential non linear output of said at least two current sources;

modifying said non linear output via a signal modifier;

wherein said modification provides a linearity to said potential non linear said current sources, and wherein said signal modifier comprises a Look Up Table.

4. An apparatus for electromagnetic processing comprising:

means for modifying at least one wave characteristic with a predetermined value, wherein said predetermined value is derived from a predetermined output of at least two independently controllable current sources, wherein said predetermined output is implemented via a signal modifier and wherein said signal modifier comprises a Look Up Table.

5. An apparatus for digital signal processing comprising:

means for deriving a wave characteristic from an electromagnetic wave;

means for modifying said wave characteristic based upon a predetermined value;

means for providing said modified wave characteristic to at least one amplifier also regulated by said modified wave characteristic so as to produce an output, wherein said predetermined value is derived through a desired output of said at least one amplifier, wherein said predetermined value is implemented via a signal modifier, and wherein said signal modifier comprises a Look Up Table.

6. An apparatus for providing linearity in a non-linear system, wherein said non linear system comprises at least two current sources, comprising:

means for determining any potential non linear output of said at least two current sources;

means for modifying said non linear output via a signal modifier;

wherein said modification provides a linearity to said potential non linear output of said current sources, and wherein said signal modifier comprises a Look Up Table.

7. A signal modifier for use in a signal processing system comprising current source potential weighted values and input state values, wherein said input state values further comprise input state values to at least two current sources, and wherein said signal modifier comprises a Look Up Table.

8. A method for generating a current comprising:

providing an electromagnetic wave;

deriving an amplitude characteristic from said electromagnetic wave;

altering said amplitude characteristic based upon a determination of error to produce an altered amplitude wave characteristic; and applying said altered amplitude wave characteristic to at least one current source to generate an output current, wherein said alteration of said amplitude wave characteristic is achieved using a Look Up Table.

9. An apparatus for correcting an electromagnetic input signal which is to be amplified by a digital amplifier, said apparatus comprising:

an input port for receiving at least an amplitude portion of said electromagnetic input signal;

a signal modifier for correcting said amplitude portion using a linear approximation based upon a predetermined non-linear output of said digital amplifier to create a corrected amplitude portion; and an output port for propagating said corrected amplitude portion, wherein said apparatus further comprising a Look Up Table based upon said non-linear output of said digital amplifier to be used to correct said amplitude portion.

* * * * *